(12) United States Patent
Rofougaran

(10) Patent No.: US 7,693,498 B2
(45) Date of Patent: Apr. 6, 2010

(54) PROBABILITY OPTIMIZED POWER AMPLIFIER MODULE AND TRANSMITTER

(75) Inventor: Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 646 days.

(21) Appl. No.: 11/529,057

(22) Filed: Sep. 28, 2006

(65) Prior Publication Data

US 2008/0081571 A1     Apr. 3, 2008

(51) Int. Cl.
*H04B 1/04* (2006.01)
(52) U.S. Cl. .................. 455/127.1; 455/323; 455/341; 330/129
(58) Field of Classification Search .............. 455/127.1, 455/127.2, 127.3, 323, 334, 341; 330/129, 330/130
See application file for complete search history.

(56) References Cited

U.S. PATENT DOCUMENTS

| | | | | |
|---|---|---|---|---|
| 6,980,780 | B2* | 12/2005 | Chen et al. ............... | 455/127.1 |
| 7,493,094 | B2* | 2/2009 | Ichitsubo et al. .......... | 455/127.1 |
| 2003/0181173 | A1* | 9/2003 | Sugar et al. ................. | 455/126 |
| 2004/0229579 | A1* | 11/2004 | Tsutsui et al. ............. | 455/127.2 |
| 2006/0046668 | A1* | 3/2006 | Uratani et al. ............ | 455/127.5 |
| 2006/0160504 | A1* | 7/2006 | Ichitsubo et al. .......... | 455/127.1 |

* cited by examiner

*Primary Examiner*—Nhan Le
(74) *Attorney, Agent, or Firm*—Garlick Harrison & Markison

(57) ABSTRACT

A power amplifier module includes a transmit power probability module and a power amplifier circuit. The transmit power probability module is coupled to determine a transmit power level probability. The power amplifier circuit is coupled to amplify an outbound radio frequency (RF) signal at a power level in accordance with the transmit power level probability and a desired transmit power level.

6 Claims, 6 Drawing Sheets

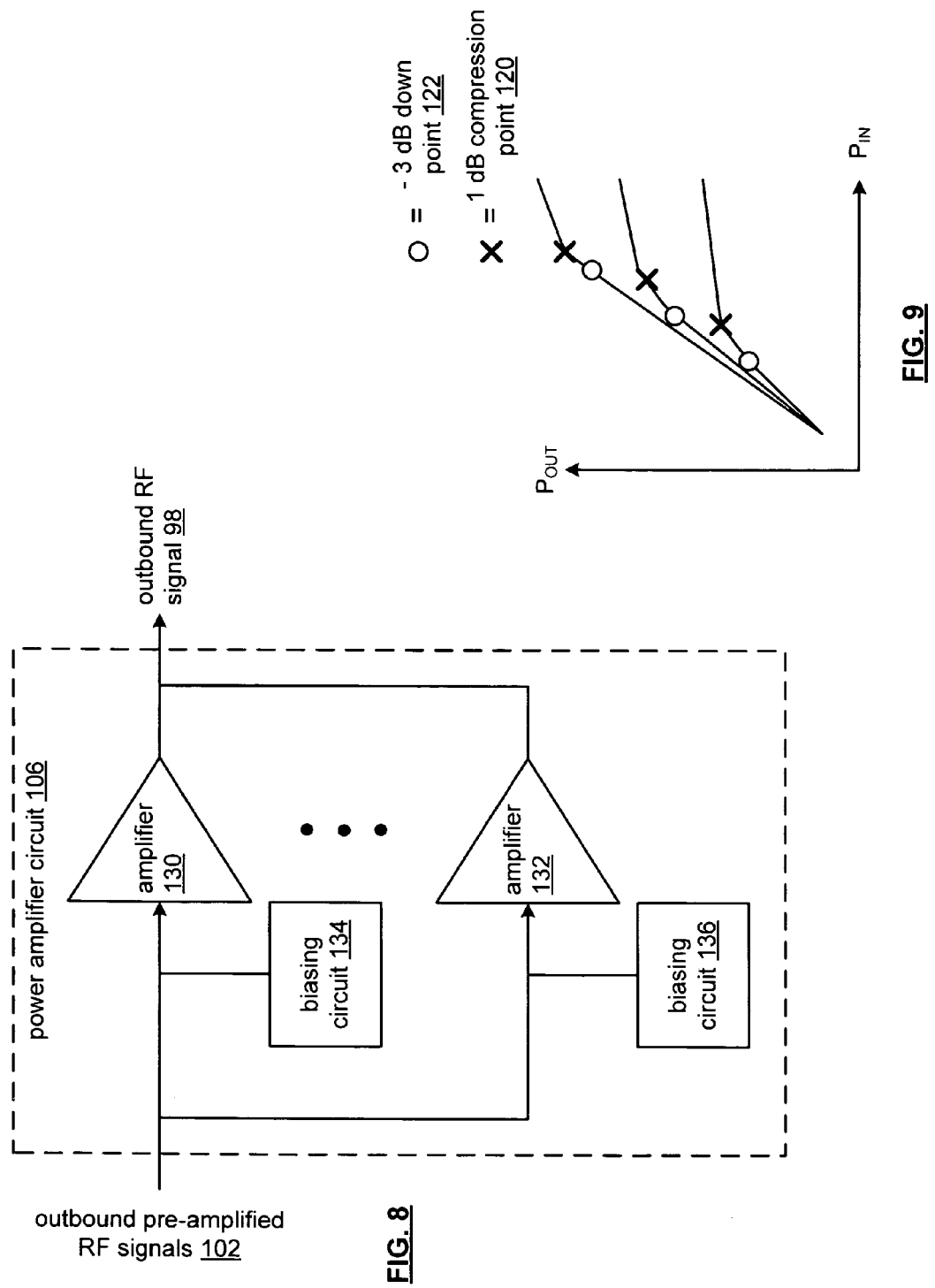

PROBABILITY OPTIMIZED POWER AMPLIFIER MODULE AND TRANSMITTER

CROSS REFERENCE TO RELATED PATENTS

NOT APPLICABLE

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to wireless communication systems and more particularly to transmitters used in such systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Currently, there are two basic types of RF transmitters: Cartesian based transmitter and a Polar coordinate based transmitter. A Cartesian based transmitter includes baseband processing and RF transmission circuitry. The baseband processing encodes, punctures, maps, interleaves, and domain converts outbound data into an in-phase (I) signal component and a quadrature (Q) signal component. For example, if the baseband processing utilizes a 64 quadrature amplitude modulation (QAM) scheme, an a first outbound data value of 101 may be ½ rate encoded into a value of 11 10 01 and a second outbound data value of 011 may be ½ rate encoded into a value of 00 11 01. After puncturing, the encoded values may be interleaved to produce a first interleaved value of 10 11 01 and a second interleaved value of 01 10 01. The first interleaved value is mapped into an I value of 101 and a Q value of 101 and the second interleaved value is mapped into an I value of 011 and a Q value of 001. Each pair of mapped I and Q interleaved values are converted into time domain signals via an inverse fast Fourier transform (IFFT) for a corresponding sub carrier of the signaling protocol (e.g., orthogonal frequency division multiplexing [OFDM]). The time domain I and Q signals are converted into analog signals via an analog to digital converter to produce the I signal component and the Q signal component.

The RF transmission circuitry includes a local oscillator, a mixing section, a linear power amplifier, and may include RF filtering. For direct conversion transmitters, the local oscillator generates an I local oscillation and a Q local oscillation, which are respectively mixed with the I signal component and the Q signal component via the mixing section. The resulting I mixed signal and Q mixed signal are summed to produce an RF signal. The linear power amplifier amplifies to the RF signal to produce an amplified RF signal that may be subsequently bandpass filtered prior to transmission.

While a Cartesian based RF transmitter provides the advantage of a single side band transmitter (i.e., do not have a negative frequencies with I and Q signals), the transmitter path (i.e., the mixing section and the power amplifier) needs to be linear to avoid loss of data resolution. In particular, the linearity requirement limits the output power of the power amplifier.

A Polar coordinate based transmitter includes baseband processing and RF transmission circuitry. The baseband processing encodes, punctures, maps, interleaves, and domain converts outbound data into polar coordinates of an amplitude (A) and a phase (Φ). For example, if the baseband processing utilizes a 64 quadrature amplitude modulation (QAM) scheme, an a first outbound data value of 101 may be ½ rate encoded into a value of 11 10 01 and a second outbound data value of 011 may be ½ rate encoded into a value of 00 11 01. After puncturing, the encoded values may be interleaved to produce a first interleaved value of 10 11 01 and a second interleaved value of 01 10 01. The first interleaved value is mapped into an amplitude value of $A_0$ and a phase value of $\Phi_0$ and the second interleaved value is mapped into an amplitude value of $A_1$ and a phase value of $\Phi_1$.

The RF transmission circuitry includes a local oscillator and a power amplifier. The local oscillator includes a phase locked loop (PLL) that generates a local oscillation at a desired RF frequency that is modulated based on phase values $\Phi_0$ and $\Phi_1$. The phase modulated RF signal is then amplitude modulated by the power amplifier in accordance with the amplitude values $A_1$ and $A_1$ to produce a phase and amplitude modulated RF signal.

While the Polar coordinate RF transmitter provides the advantages of reduced RF filtering due to the response of the PLL and the use of a non-linear power amplifier (which, for the same die area, is capable of greater output power than a linear power amplifier), there are some disadvantages. For instance, the response of the PLL is narrow, thus limiting the RF transmitter to narrow band uses. Further, maintaining synchronization between the phase values and the amplitude values can be difficult due to the delays within the PLL. Still further, the baseband processing is utilizing real signals, thus has to account for potential negative frequencies.

From the foregoing, the Cartesian based RF transmitter and Polar based RF transmitter each have their advantages and disadvantages. In addition, both types of transmitters are designed to transmit signals over a wide range of transmit power levels (e.g., from −50 dB to +28 dB) depending on current transmission conditions. While there is a vast range over which the power amplifier of the transmitter may transmit, empirical data has shown that there is a high probability that, for a majority of the time, the power amplifier will transmit at a power level much smaller than the full range (e.g., −25 dB to +15 dB). In addition, a linear power amplifier is most efficient when operating about 3 dB down from its 1 dB compression point.

Therefore, a need exists for a transmitter and power amplifier module that operates efficiently based on transmit power level probability.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

FIG. 8 is a schematic block diagram of another embodiment of a power amplifier circuit in accordance with the present invention;

FIG. 9 is a graph of adjusting performance of a power amplifier in accordance with the present invention.

DETAILED DESCRIPTION OF THE INVENTION

Figure 1:
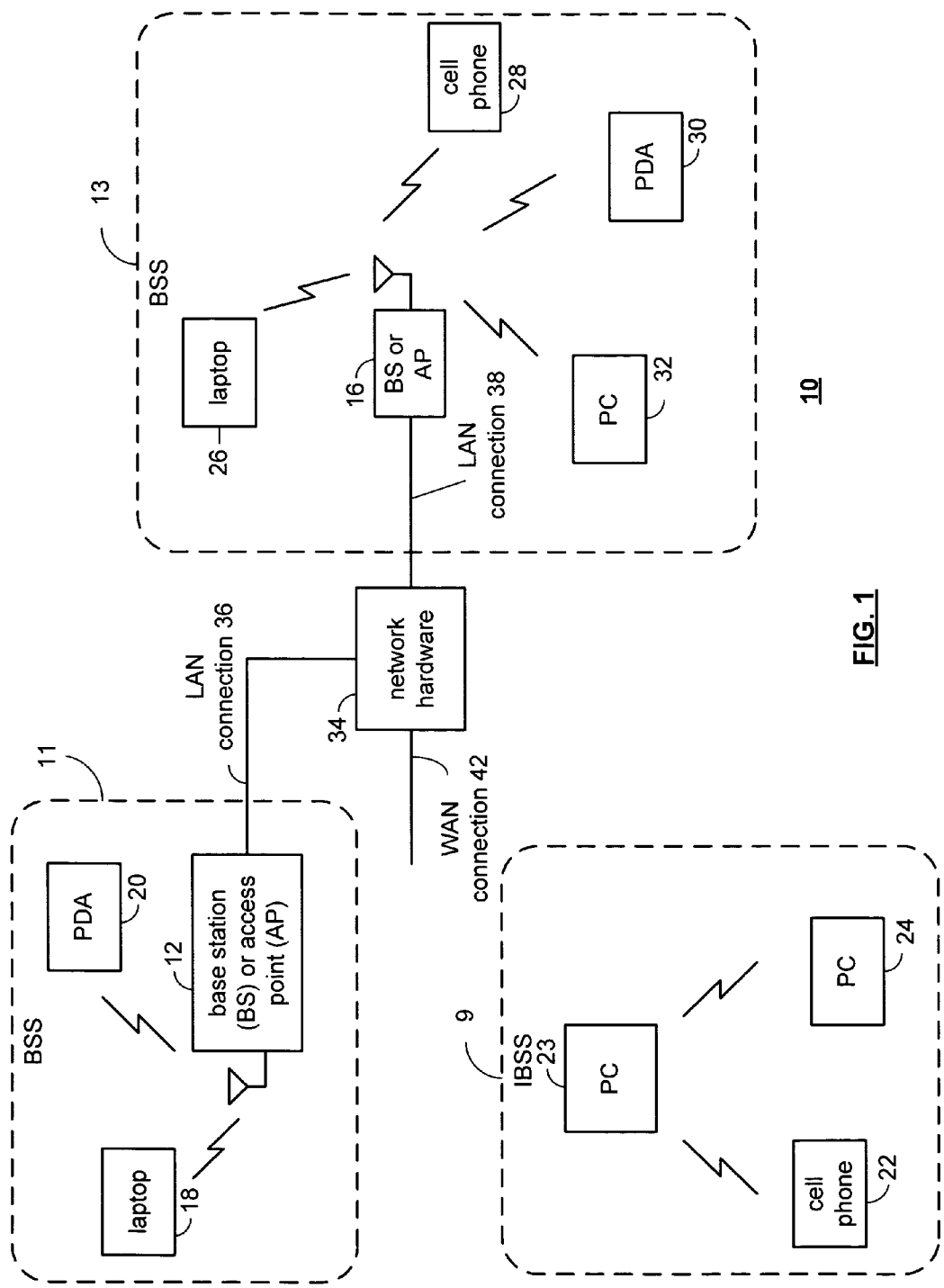
FIG. 1 is a schematic block diagram of a wireless communication system in accordance with the present invention.

FIG. 1 illustrates a schematic block diagram of a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
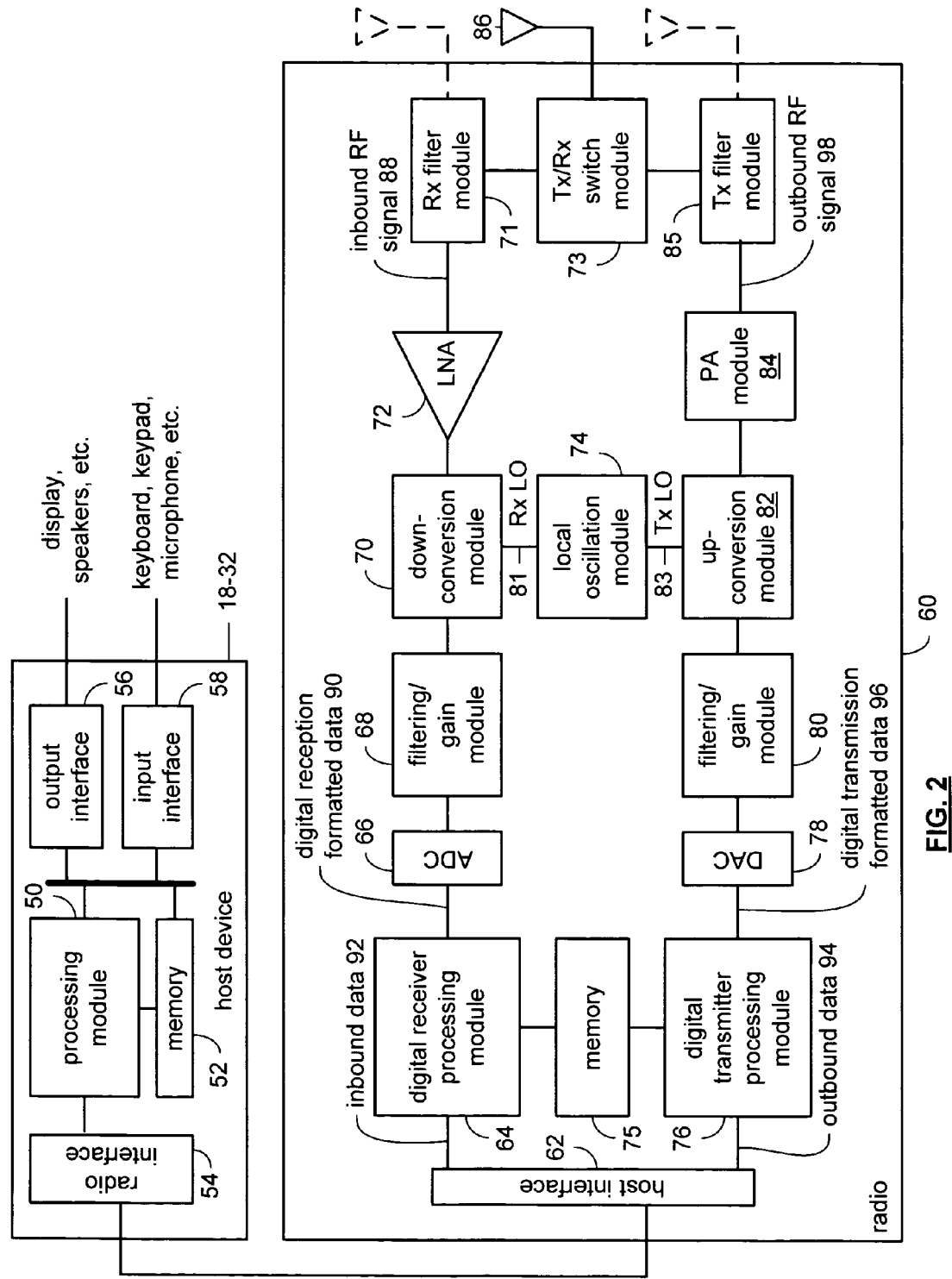
FIG. 2 is a schematic block diagram of a wireless communication device in accordance with the present invention.

FIG. 2 illustrates a schematic block diagram of a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, analog-to-digital converter 66, filtering/gain module 68, down conversion module 70, low noise amplifier 72, local oscillation module 74, memory 75, digital transmitter processing module 76, digital-to-analog converter 78, filtering/gain module 80, up-conversion module 82, power amplifier 84, and an antenna 86. The antenna 86 may be a single antenna that is shared by the transmit and receive paths or may include separate antennas for the transmit path and receive path. The antenna implementation will depend on the particular standard to which the wireless communication device is compliant. Note that in one embodiment, the up conversion module 82 and power amplifier module 84 may be considered an RF transmitter.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transmitter local oscillation provided by local oscillation module 74. The power amplifier 84, which will be described in greater detail with reference to FIGS. 3, 5, 8, and 10, amplifies the RF signal to produce outbound RF signal 98. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the low noise amplifier 72, which amplifies the signal 88 to produce an amplified inbound RF signal. The low noise amplifier 72 provide the amplified inbound RF signal to the down conversion module 70, which directly converts the amplified inbound RF signal into an inbound low IF signal based on a receiver local oscillation provided by local oscillation module 74. The down conversion module 70 provides the inbound low IF signal to the filtering/gain module 68, which filters and/or adjusts the gain of the signal before providing it to the analog to digital converter 66.

The analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

Figure 3:
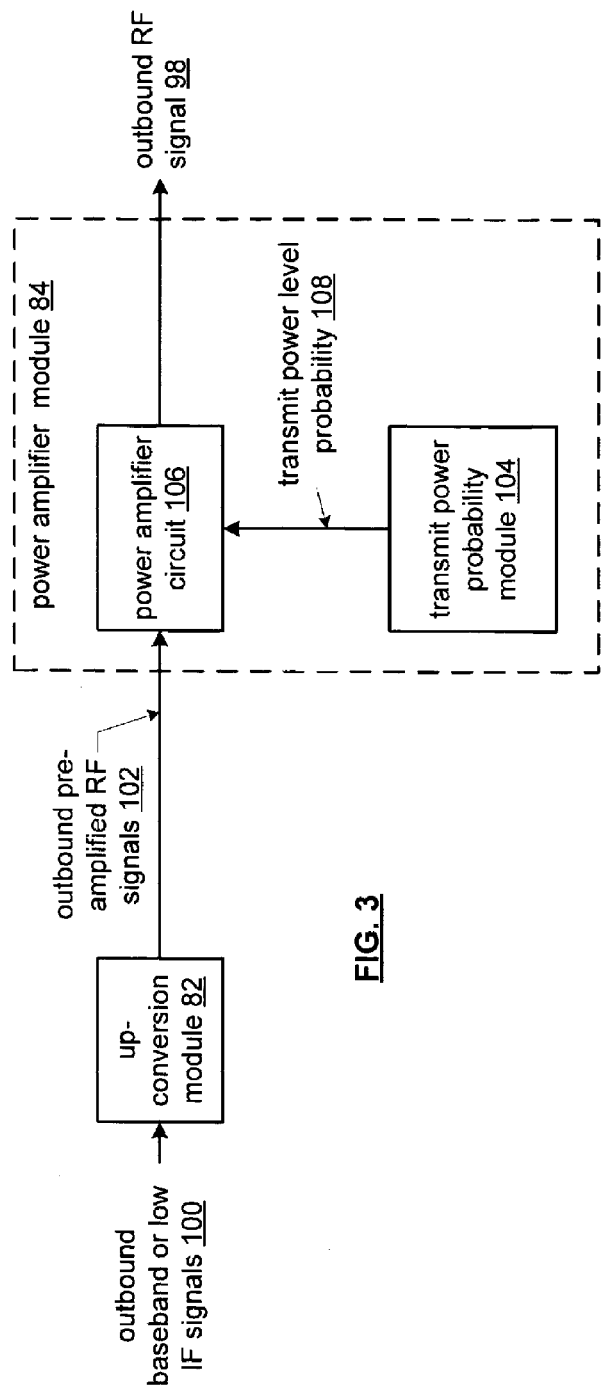
FIG. 3 is a schematic block diagram of an embodiment of an up-conversion module and a power amplifier module in accordance with the present invention.
Figure 4:
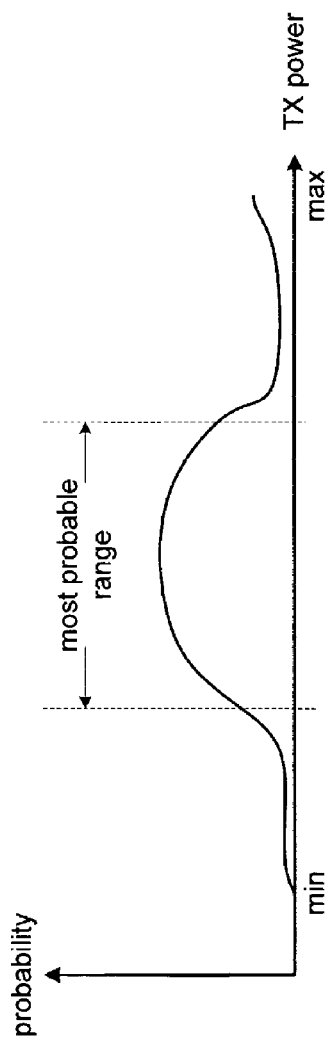
FIG. 4 is a graph of an example of a transmit power level probability curve in accordance with the present invention.

FIG. 3 is a schematic block diagram of an embodiment of an RF transmitter that includes an up-conversion module 82 and a power amplifier module 84. The power amplifier module 84 includes a transmit power probability module 104 and a power amplifier circuit 106. The transmit power probability module 104 is coupled to determine a transmit power level probability 108. The transmit power probability module 104 may determine the transmit power level probability based on empirical data stored in memory and/or based on a histogram of power level settings of the power amplifier module. For example, as shown in FIG. 4, the transmit power probability module 104 may determine the power level settings that range from a minimum value to a maximum value. As shown, the curve also includes a most probable range. For example, the minimum value may be −50 dB, the maximum value may be +28 dB, and the most probable range may be −25 dB to +15 dB.

Figure 5:
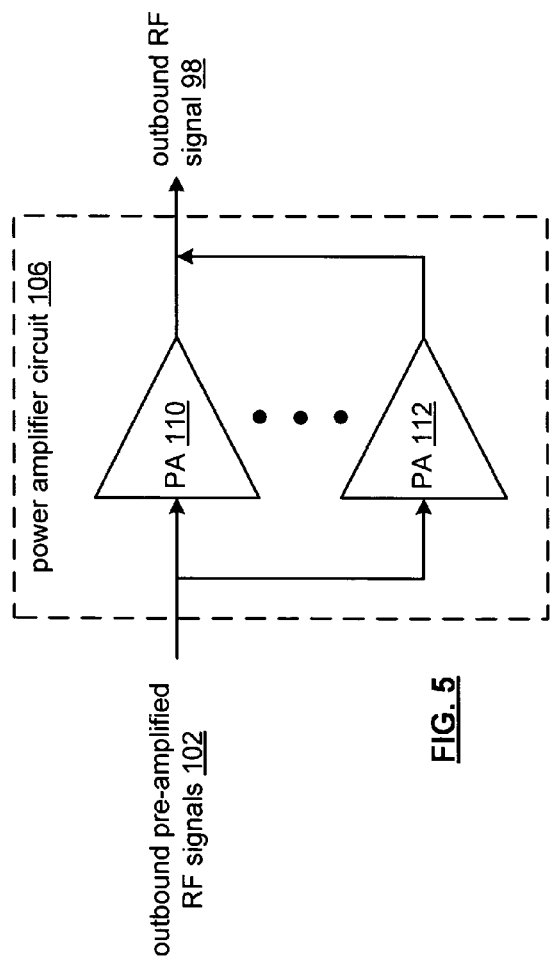
FIG. 5 is a schematic block diagram of an embodiment of a power amplifier circuit in accordance with the present invention.
Figure 10:
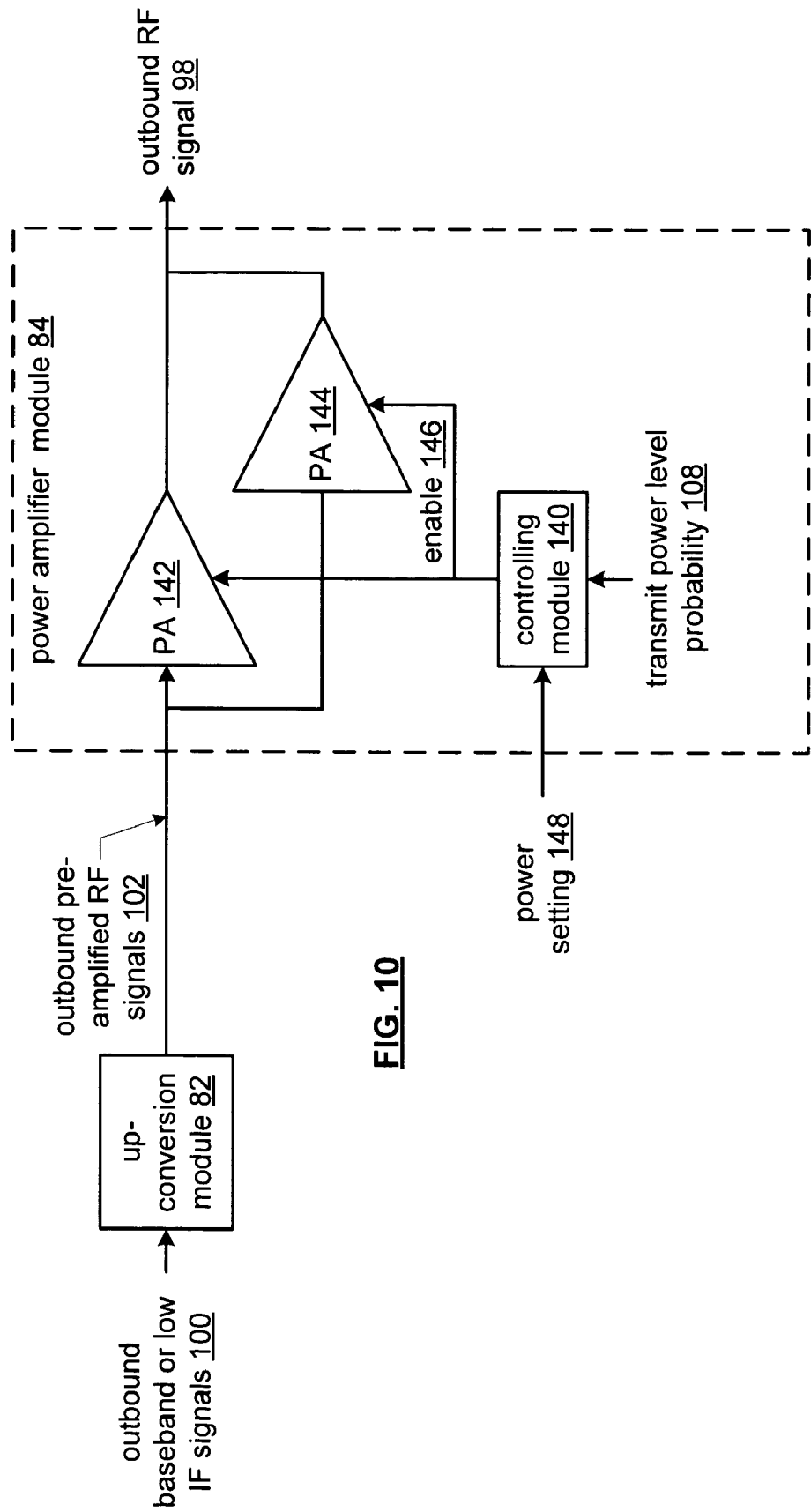
FIG. 10 is a schematic block diagram of another embodiment of an up-conversion module and a power amplifier module in accordance with the present invention.

Returning to the discussion of FIG. 3, the power amplifier circuit 106, which may include one or more power amplifiers and/or pre-amplifiers as will be discussed in greater detail with reference to FIGS. 5, 8, and 10, is coupled to amplify an outbound radio frequency (RF) signal at a power level in accordance with the transmit power level probability 108 and a desired transmit power level. The power amplifier circuit 106 is optimized based on the transmit power level probability 108 to amplify the outbound RF signal 102 at the desired transmit power level. As such, for a majority of the time, the power amplifier circuit 106 is operating at or near its most efficient point and operates at less efficient points for transmit power levels that are outside of the most probable range. However, since the less efficient operation occurs much less than the optimal efficiency operation, the overall efficiency of the power amplifier is improved.

FIG. 5 is a schematic block diagram of an embodiment of a power amplifier circuit 106 that includes a plurality of power amplifiers 110 and 112. The power amplifiers 110 and 112 are operable in accordance with the transmit power level probability 108 to provide the desired transmit power level of the outbound pre-amplifier RF signals 102 to produce the outbound RF signals 98. For instance, each of the power amplifiers 110 and 112, when in a linear mode, have a power input to power output curve as shown in FIG. 6.

Figure 6:
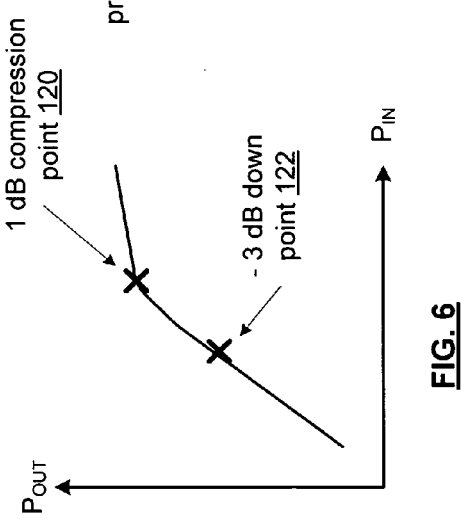
FIG. 6 is a graph of a linear power amplifier in accordance with the present invention.

In FIG. 6, the power amplifier 110-112 is substantially linear up to its 1 dB compression point 120. Further, the power amplifiers 110 and 112 are most efficient at the −3 dB down point 122 from the 1 dB compression point 120. As, for the most probable power levels, it is desirous to have the power amplifiers 110 and 112 operating at or near the −3 dB down point 122. An example of this is shown in FIG. 7.

Figure 7:
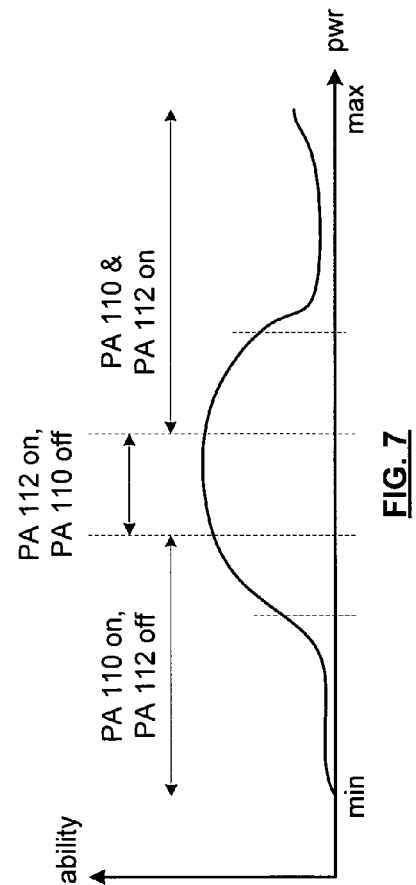
FIG. 7 is a graph of an example of a transmit power level probability curve and power amplifier operation in accordance with the present invention.

FIG. 7 is a graph of an example of a transmit power level probability curve and power amplifier 110-112 operation. In this example, the most probable range of the transmit power level probability curve is divided into three sections. In the first section, power amplifier 110 is on and power amplifier 112 is off. For this section, the power amplifier 110 is configured (i.e., gain setting, bias setting, supply voltage setting, etc.) to provide optimum efficiency. In the second section, power amplifier 112 is on and power amplifier 110 is off. For this section, the power amplifier 112 is configured (i.e., gain setting, bias setting, supply voltage setting, etc.) to provide optimum efficiency. In the third section, both power amplifiers 110 and 112 are on and configured to provide optimum efficiency. As one of ordinary skill in the art will appreciate, the power amplifier circuit 106 may include more than two power amplifiers and that each power amplifier may have the same power amplification capabilities and/or different power amplification capabilities.

In an embodiment, when the desired transmit power level exceeds a threshold of where the power amplifier circuit 106 is optimally efficient in a linear mode, the radio 60 may change from having a Cartesian based RF transmitter to a Polar based RF transmitter. In the Polar based RF transmitter, the power amplifier circuit 106 does not need to be linear, thus it can run at power levels above the 1 dB compression point efficiently and without loss of information.

FIG. 8 is a schematic block diagram of another embodiment of a power amplifier circuit 106 that includes a plurality of amplifiers 130-132 and a plurality of biasing circuits 134-136. The plurality of amplifiers 130-132 amplify the outbound pre-amplified RF signals 102 to produce the outbound RF signals 98 in accordance with the biasing provided by the biasing circuits 134-136.

The biasing circuits 134-136 adjust the biasing of the power amplifiers 130-132 based on the transmit power level probability 108 and the desired transmit power level such that the operating point of the power amplifiers 130-132 is optimized for the desired transmit power level. FIG. 9 is a graph illustrates the adjusting the power amplifier in 130-132 operating point. The three curves represent different biasing levels for the power amplifier 130-132. On each of the curves, the circle represents the −3 dB down point 122 and the X represents the 1 dB compression point 120. As such, a power amplifier may be designed to have the properties shown in FIG. 9 for a given region of the most probable range of the probability curve. Thus, when the desired transmit power level is with the given region, the power amplifier may be adjusted to provide optimal efficiency for the desired transmit power level.

FIG. 10 is a schematic block diagram of another embodiment of an RF transmitter that includes the up-conversion module 82 and the power amplifier module 84. In this embodiment, the power amplifier module 84 includes first and second power amplifiers 142 and 144 and a controlling module 140.

In operation, the up-conversion module 82 converts the outbound baseband or low IF signals 100 into outbound pre-amplified RF signals 102. The first power amplifier 142 has its amplification (e.g., gain setting, supply voltage, biasing level, etc.) set for optimal efficiency in accordance with most probable transmit power level settings within a transmit power level range to amplify the outbound pre-amplified RF signal when enabled. The second power amplifier 144 has its amplification set for optimal efficiency in accordance with the most probable transmit power level settings within the transmit power level range to amplify the outbound pre-amplified RF signal when enabled.

The controlling module 140 enables 146 one of the first and second power amplifiers 142 and 144 to amplify the outbound RF signal 102 in accordance with a power setting 148 when the power setting is not within the most probable transmit power level settings. The controlling module 140 enables 146 at least one of the first and second power amplifiers 142 and 144 to amplify the outbound RF signal 102 in accordance with the power setting 148 when the power setting is within the most probable transmit power level settings of a transmit power level probability 108.

In an embodiment, the controlling module 140 enables 146 the first power amplifier 142 to amplify the outbound RF signal in accordance with the power setting 148 when the power setting is within a first range of the most probable transmit power level settings. Note that the power amplifier 142 is optimized for performance within the first range of the most probable transmit power level settings. Further note that the optimal performance may be fixed within the first range or adjustable by adjusting one or more of the biasing, gain setting, supply voltage, etc. In this embodiment, the controlling module 140 enables 146 the first and second power amplifiers 142 and 144 to amplify the outbound RF signal 102 in accordance with the power setting 148 when the power setting is within a second range of the most probable transmit power level settings. In this instance, the first and second power amplifiers 142 and 144 are optimized for performance within the second range.

In another embodiment, the controlling module 140 determines a first bias adjust indication based on the power setting 148 and the first range of the most probable transmit power level settings. The controlling module 140 then provides the first bias adjust indication to the first power amplifier 142 such that the first power amplifier 142 adjusts its biasing in accordance with the first bias adjust indication to maintain the amplification for optimal efficiency.

In another embodiment or as an extension of the preceding embodiment, the controlling module 140 determines a second bias adjust indication based on the power setting 148 and the second range of the most probable transmit power level settings. The controlling module 140 then provides the second bias adjust indication to the second power amplifier 144 such that the second power amplifier 144 adjusts its biasing in accordance with the second bias adjust indication to maintain the amplification for optimal efficiency. Note that the providing the biasing indication to the power amplifiers 142 and 144 may be done with the connection to enable the amplifiers.

In another embodiment, the controlling module 140, which may be a separate processing module and/or included in the digital receiver and/or transmit processing module 64 and 76, enables the first power amplifier 142 to amplify the outbound RF signal 102 in accordance with the power setting 148 when the power setting is within a first range of the most probable transmit power level settings. Further, the controlling module 140 enables the second power amplifier 144 to amplify the outbound RF signal 102 in accordance with the power setting 148 when the power setting is within a second range of the most probable transmit power level settings. Still further, the controlling module 140 enables the first and second power amplifiers 142 and 144 to amplify the outbound RF signal 102 in accordance with the power setting 148 when the power setting is within a third range of the most probable transmit power level settings.

In another embodiment, the power amplifier module 84 further comprises a third power amplifier having its amplification set for optimal efficiency in accordance with the most probable transmit power level settings within the transmit power level range. In this embodiment, the controlling module enables one of the first, second, and third power amplifiers to amplify the outbound RF signal in accordance with a power setting 148 when the power setting is not within the most probable transmit power level settings. The controlling module 140 enables at least one of the first, second, and third power amplifiers to amplify the outbound RF signal in accordance with the power setting when the power setting is within the most probable transmit power level settings.

In yet another embodiment, the controlling module enables one of the first and second power amplifiers 142 and 144 to amplify the outbound RF signal in accordance with the power setting 148 when the power setting is a low power low probability setting that is not within the most probable transmit power level settings. The controlling module 140 provides an indication to the first and second power amplifiers to adjust biasing for a substantially maximum transmit power level and enables the first and second power amplifiers to amplify the outbound RF signal in accordance with the power setting when the power setting is a high power low probability setting that is not within the most probable transmit power level settings.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output (s),etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A power amplifier module comprising:
   a transmit power probability module coupled to determine a transmit power level probability;
   a power amplifier circuit coupled to amplify an outbound radio frequency (RF) signal at a power level in accordance with the transmit power level probability and a desired transmit power level, the power amplifier circuit includes a plurality of selectable power amplifiers, wherein at least one of the plurality of selectable power amplifiers is enabled based on the transmit power level probability and the desired transmit power level to amplify the outbound RF signal at the desired transmit power level; and
   an adjustable biasing circuit coupled to adjust biasing of the at least one of the plurality of selectable power amplifiers based on the desired transmit power level to maintain optimal efficiency in accordance with a corresponding most probable power level of the transmit power level probability.

2. The power amplifier module of claim 1, wherein the transmit power probability module determines the transmit power level probability based on empirical data stored in a memory.

3. The power amplifier module of claim 1, wherein the transmit power probability module determines the transmit power level probability based on a histogram of power level settings of the power amplifier module.

4. A radio frequency (RF) transmitter comprising:
   an up-conversion module coupled to convert an outbound baseband or low intermediate frequency (IF) signal into an outbound radio frequency (RF) signal; and
   a power amplifier module that includes:
      a transmit power probability module coupled to determine a transmit power level probability;
      a power amplifier circuit coupled to amplify the outbound RF signal at a power level in accordance with the transmit power level probability and a desired transmit power level, the power amplifier circuit includes a plurality of selectable power amplifiers, wherein at least one of the plurality of selectable power amplifiers is enabled based on the transmit power level probability and the desired transmit power level to amplify the outbound RF signal at the desired transmit power level; and
      an adjustable biasing circuit coupled to adjust biasing of the at least one of the plurality of selectable power amplifiers based on the desired transmit power level to maintain optimal efficiency in accordance with a corresponding most probable power level of the transmit power level probability.

5. The RF transmitter of claim 4, wherein the transmit power probability module determines the transmit power level probability based on empirical data stored in memory.

6. The RF transmitter of claim 4, wherein the transmit power probability module determines the transmit power level probability based on a histogram of power level settings of the power amplifier module.

* * * * *